United States Patent

Weber et al.

Patent Number: 5,413,863
Date of Patent: May 9, 1995

[54] RECORDING MEDIUM WITH INPROVED ADHESION TO GLASS

[75] Inventors: Andrew M. Weber; Aleksander Beresniewicz, both of Wilmington, Del.

[73] Assignee: E. I. Du Pont de Nemours and Company, Wilmington, Del.

[21] Appl. No.: 146,817

[22] Filed: Nov. 4, 1993

[51] Int. Cl.⁶ .............. B32B 17/06; G03C 1/725
[52] U.S. Cl. .............. 428/428; 428/429; 428/436; 428/437; 428/441; 428/442; 428/501; 428/520; 430/2; 430/14; 430/281; 430/282; 430/905; 430/907; 430/909; 430/916; 522/116; 522/121; 525/102; 526/254; 526/255; 526/279
[58] Field of Search .............. 430/1, 2, 281, 282, 430/905, 907, 909, 916, 14; 522/116, 121; 525/102; 526/254, 255, 279; 428/428, 429, 436, 437, 441, 442, 501, 520; 296/84.1

[56] References Cited

U.S. PATENT DOCUMENTS 4,886,862 12/1989 Kuwamura et al. .............. 526/247
4,963,471 10/1990 Trout et al. .............. 430/282

OTHER PUBLICATIONS

Abstract—Japanese Patent Publication 63 191840, published Aug. 9, 1988, to Mitsui Toatsu CHem Inc.
Abstract—Japanese Patent Publication 03 215544, issued Sep. 29, 1991, to Nippon Skokubai Co. Ltd.
Abstract—Japanese Patent Publication 01 060616, issued Mar. 7, 1989, to Nippon Mektron KK.
Abstract—Japanese Patent Publication 63 027564, issued Feb. 5, 1988, to Dainippon Ink Chem KK.
Abstract—Japanese Patent Publication 61 029286, issued Sep. 17, 1986, to Nippon Oils and Fats KK.

Primary Examiner—D. S. Nakarani

[57] ABSTRACT

Holographic films are disclosed that contain a binder having the following formula:

$$(M)_w(VAc)_x(VOH)_y(VOS)_z$$

wherein M is a fluoromonomer; VAc is vinyl acetate; VOH is vinyl alcohol; and VOS is vinyl trimethylsilyl ether; and wherein w, x, y, and z are percentages by weight; w is 5 to 30, x is 40 to 80, y is 0 to 20, and z is 2 to 30; said copolymers containing 3 to 23% by weight fluorine. These imaged films are particularly suited for lamination to glass in head-up display applications.

16 Claims, 1 Drawing Sheet

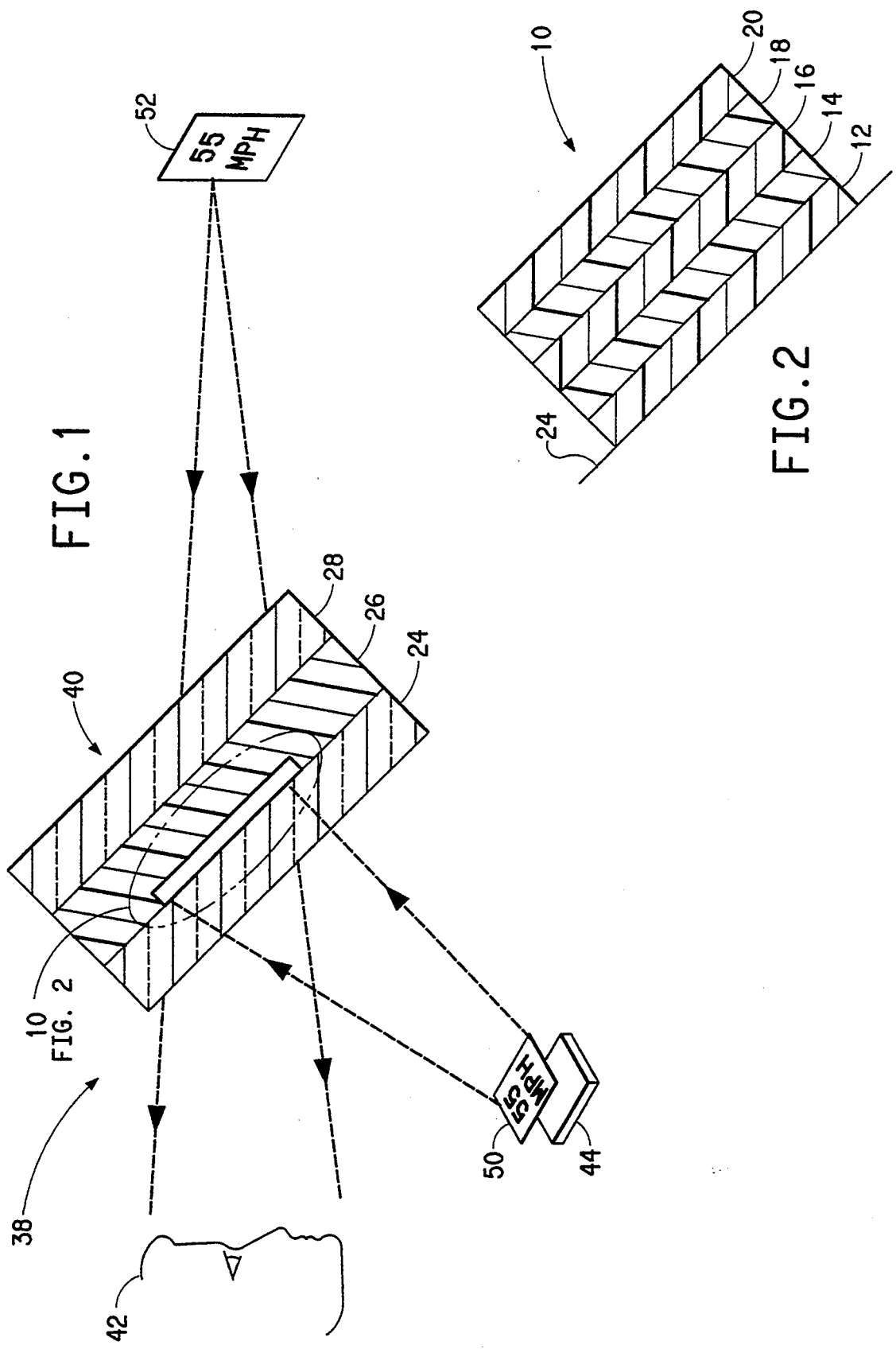

RECORDING MEDIUM WITH INPROVED ADHESION TO GLASS

FIELD OF THE INVENTION

This invention relates to refractive index imaging and, more particularly, to photopolymerizable compositions and elements for recording refractive index images (e.g., holograms) in which the binder contains a copolymer of a fluoromonomer, vinyl acetate, vinyl alcohol, and trimethylsilyl vinyl ether.

BACKGROUND OF THE INVENTION

Holographic recording films containing fluorinated binders are disclosed in U.S. Pat. No. 4,963,471 to Trout. A variety of fluorinated binders are taught by Trout, with copolymers of vinyl acetate and perfluorinated monomers, such as tetrafluoroethylene and/or hexafluoropropylene, yielding particularly favorable results in terms of high refractive index modulation values, which represent reflection performance of the hologram.

The compositions disclosed by Trout have numerous properties suitable for the preparation of head-up displays. However, the disclosed compositions do not provide the desired adhesion to adjacent glass layers, and high clarity (i.e., lack of haze), required for a commercial head-up display optical combiner. Thus, a need exists for specific compositions that not only provide advantages taught by Trout, but also provide the desired properties of good adhesion to glass and high clarity for use in holography, and particularly for use in constructing single, full color holographic films used in applications such as optical combiners in head-up displays.

SUMMARY OF THE INVENTION

In one embodiment this invention provides an improved, photopolymerizable film composition containing a binder, a monomer, and a photoinitiator adapted for the preparation of refractive index images, including holograms, wherein the binder is a copolymer having the formula:

$$(M)_w(VAc)_x(VOH)_y(VOS)_z$$

wherein M is a fluoromonomer, VAc is vinyl acetate, VOH is vinyl alcohol, VOS is vinyl trimethylsilyl ether, w, x, y, and z are weight percentages and w is about 5 to 30%, x is about 40 to 80%, y is about 0 to 20%, and z is about 2 to 30%, with the proviso that said polymer contains about 3 to 23% fluorine by weight.

In a preferred embodiment w is 20 to 27%, x is 50 to 75%, y is 2 to 10%, and z is 5 to 25%. M is preferably tetrafluoroethylene and/or hexafluoro-propylene.

In another embodiment, this invention provides a reflection hologram prepared from this composition. In still another embodiment, this invention provides an optical combiner having a reflection hologram prepared from this composition. In yet another embodiment, this invention provides a laminated structure, such as a windshield, containing an optical combiner mounted between two rigid, transparent plies bonded together with a suitable polymeric adhesive, such as polyvinyl butyral. The rigid transparent plies typically are glass.

BRIEF DESCRIPTION OF THE DRAWINGS

FIG. 1 illustrates a head-up display system, which comprises an optical combiner.

FIG. 2 illustrates a preferred structure for an optical combiner.

DETAILED DESCRIPTION OF THE INVENTION PHOTOPOLYMERIZABLE COMPOSITION

The photopolymerizable composition contains a fluorine-containing organic polymeric binder(s), an addition polymerizable ethylenically unsaturated monomer, and an initiator system capable of being activated by actinic radiation. Other components conventionally added to photopolymerizable compositions may be present to modify the properties of composition. A useful discussion of the components of photopolymerizable compositions is found in "Photopolymers: Radiation Curable Imaging Systems", by B. M. Monroe, in *Radiation Curing: Science and Technology*, S. P. Pappas, Ed., Plenum, N.Y., 1992, pp. 399–440.

BINDER

The fluorinated binders selected in practicing the invention have the following formula:

$$(M)_w(VAc)_x(VOH)_y(VOS)_z$$

where M is a fluoromonomer; VAc is vinyl acetate; VOH is vinyl alcohol; and VOS is vinyl trimethylsilyl ether.

Perfluorinated fluoromonomers, especially tetrafluoroethylene (TFE) and hexafluoropropylene (HFP), have been found to be particularly useful fluoromonomers (M) and are preferred. Other fluoromonomers, such as vinyl fluoride, vinylidene fluoride, trifluorochloroethylene, fluoroolefins, fluorinated vinyl ethers (such as 2,2,2-trifluoroethyl vinyl ether) and fluoroalkyl acrylates and methacrylates (such as 2,2,2-trifluoroethyl acrylate) may be selected for specific applications. Combinations of two or more fluoromonomers may also be used.

The presence of fluorine in the binder reduces the refractive index of the polymer, thereby increasing the refractive index modulation value achieved after imaging and processing the hologram. For a fixed monomer/binder/photoinitiator composition, and for fixed exposure and processing conditions, the refractive index modulation increases with fluorine content. However, the binder should not contain so much fluorine that the resulting film is opaque. Accordingly, the binder contains approximately 3 to 23% total fluorine by weight, with the fluoromonomer constituting approximately 5 to 30%, preferably 20 to 27%, by weight, of the binder.

Vinyl acetate (VAc) will be present in approximately 40 to 80% by weight, preferably 50 to 75% by weight. However, copolymers made essentially of vinyl acetate and fluoromonomers have poor adhesion to glass, which limits their use in applications in which adhesion to glass is required, such as head-up displays.

Adhesion to glass is substantially improved by hydrolysis of a portion of the vinyl acetate to form a fluoromonomer/vinyl acetate/vinyl alcohol copolymer. However, the refractive index modulation of the resulting hologram is adversely affected by the presence of too much vinyl alcohol in the binder. Surprisingly, the refractive index modulation is improved by conversion of most or all of the alcohol groups to trimethylsilyl ethers (VOS). Adhesion, however, remains adequate for applications in which the hologram must adhere to glass. The binders of this invention contain approximately 0 to 20% by weight, preferably 2 to 10% by weight, of vinyl alcohol, and approximately 2 to 30% by weight, preferably 5 to 25% by weight, of vinyl trimethylsilyl ether.

The binder may also include other monomers. Typical comonomers are vinyl ethers, such as methyl vinyl ether, ethyl vinyl ether, propyl vinyl ether and butyl vinyl ether; acrylates, such as methyl acrylate; and methacrylates, such as methyl methacrylate. Furthermore, the binder may also include chlorotri-fluoroethylene as a comonomer.

As will be appreciated by those skilled in the art, the binders need not be prepared by polymerization of the monomers indicated in their structure. Listing of these monomers merely indicates the composition of the binders (as the number of copolymerized monomer repeat units in the binder), not the process by which they were prepared.

The binders of this invention may be prepared by the following process. Vinyl acetate is copolymerized with a fluoromonomer, or a mixture of fluoromonomers, using conventional free-radical polymerization processes to produce a copolymer of vinyl acetate and fluoromonomer. Such processes are disclosed, for example, in Trout, U.S. Pat. No. 4,963,471. If desired, additional monomers, such as vinyl ethers, may be copolymerized with the fluoromonomer and vinyl acetate.

The vinyl acetate/fluoromonomer copolymer is converted to a vinyl acetate/vinyl alcohol/fluoromonomer copolymer by partial hydrolysis or partial alcoholysis in, for example, basic methanol. Methods for the production of polyvinyl alcohol from polyvinyl acetate, that are well known in the art, can be used for this transformation.

The binders then are prepared by partial or complete silylation of the vinyl acetate/vinyl alcohol/fluoromonomer copolymer. Silylation may be carried out with hexamethyldisilazane (HMDS) catalyzed by trimethylsilyl triflate (TMST) in an anhydrous solvent, such as anhydrous tetrahydrofuran. Other silylating agents may be used. See, for example, Chapter 15 of E. Colvins "*Silicon in Organic Synthesis*", Butterworths Monographs in Chemistry and Chemical Engineering, 1981.

Fluorinated binders provided by this invention may be selected for only a portion of the total binder if so desired. In this case, the non-fluorinated binder or binders must be compatible with each and with the other components of the photosensitive composition, without undue sacrifice of film clarity, mechanical properties, etc.

MONOMERS

Photopolymerizable compositions contain at least one ethylenically unsaturated monomer, that undergoes free-radical initiated polymerization to form a high molecular weight compound. Suitable monomers are well known in the art. In general, preferred monomers for photopolymer applications have boiling points greater than 100° C., more preferably, greater than 150° C.

Monomers suited for use in photopolymerizable compositions adapted for recording holograms are disclosed in: Haugh, U.S. Pat. No. 3,658,526; Chandross, U.S. Pat. No. 3,993,485; Fielding, U.S. Pat. Nos. 4,535,041 and 4,588,664; Keys, U.S. Pat. No. 4,942,102; Monroe, U.S. Pat. No. 4,942,112; Smothers, U.S. Pat. No. 4,959,284; and Trout, U.S. Pat. No. 4,963,471, as well as in B. M. Monroe and W. K. Smothers, *Polymers for Lightwave and Integrated Optics: Technology and Applications, Part I: Foundations*, L. A. Hornak, Ed., Marcel Dekker, N.Y., 1992, pp 145–170. In the preferred compositions, the monomer has one or more of the following moieties: (1) an aromatic moiety that is selected from the group consisting of (i) substituted or unsubstituted phenyl, (ii) substituted or unsubstituted naphthyl, or (iii) substituted or unsubstituted heterocyclic aromatic moieties having up to three rings; (2) chlorine; (3) bromine, or mixtures thereof; and the binder is substantially free of said moiety or moieties.

Useful liquid monomers include, for example: 2-phenoxyethyl acrylate, 2-phenoxyethyl methacrylate, phenol ethoxylaue monoacrylate, 2-(p-chlorophenoxy) ethyl acrylate, phenyl acrylate, 2-(1-naphthyloxy)ethyl acrylate, ethyl 1-benzoyl-2-vinyl-1-cyclopropane carboxylate, etc. Solid monomers, which may be used to advantage in combination with liquid monomers, include: N-vinylcarbazole; 2,4,6-tribromophenyl acrylate or methacrylate; pentachlorophenyl acrylate or methacrylate; 2-naphthyl acrylate or methacrylate.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition preferably is a liquid. Representative polyfunctional monomers include the di-(2-acryl-oxyethyl)ether of bisphenol A, and ethoxylated bisphenol A diacrylate.

INITIATOR SYSTEMS

The initiator system has one or more compounds which directly furnish free-radicals when activated by actinic radiation. By "actinic radiation" is meant radiation which is active to produce the free-radicals necessary to initiate polymerization of the monomer. The initiator system also can constitute a plurality of compounds, one of which yields the free-radicals after having been caused to do so by another compound (i.e., sensitizer) that is activated by the radiation.

Conventional initiator systems, such as: photoreducible dyes and reducing agents, ketones, quinones, dye-borate complexes, and trichloromethyl triazines, can be used to initiate photopolymerization. Photoinitiators are discussed in: "Photopolymers: Radiation Curable Imaging Systems" by B. M. Monroe in *Radiation Curing: Science and Technology*, S. P. Pappas, Ed, Plenum, N.Y., 1992, pp. 399–440, and by K. K. Dietliker, in *Chemistry and Technology of UV and EB Formulation for Coatings, Inks, and Paints*, "Free-Radical Polymerization", P. K. T. Oldring, Ed, SITA Technology Ltd, London, Vol. 3, 1991, pp 60–525.

Preferred initiator systems contain the 2,4,5-triphenylimidazolyl dimers disclosed in Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. Preferred 2,4,5-triphenylimidazolyl dimers are 2-o-chlorosubstituted hexaphenylbisimidazoles in which the other positions on the phenyl radicals are unsubstituted or substituted with chloro, methyl or methoxy groups such as CDM-HABI, i.e., 2-(o-chlorophenyl)-4,5-bis(m-methoxyphenyl)-imidazole dimer; o-Cl-HABI, i.e., biimidazole, 2,2′-bis (2-o-chlorophenyl)-4,4′5,5′-tetraphenyl-; and TCTM-HABI, i.e., 1H-imidazole, 2,5-bis(o-chlorophenyl)-4-

[3,4-dimethoxyphenyl]-, dimer, each of which is typically used with a hydrogen donor.

Preferred sensitizers include those disclosed in: Baum and Henry, U.S. Pat. No. 3,652,275; Dueber, U.S. Pat. No. 4,162,162; Smothers, U.S. Pat. No. 4,917,977; and Monroe, U.S. Pat. No. 4,987,230. Particularly preferred sensitizers include: cyclopentanone, 2,5-bis[4-(diethylamino)phenyl]methylene]; cyclopentanone, 2,5-bis[(2,3,6,7-tetrahydro-1H, 5H-benzo[i,j]quinolizin-9-yl)methylene]; cyclopentanone, -2,5-bis[2-(1,3-dihydro-1,3,3-trimethyl-2H-indol-2-ylidene)ethylidene]; and cyclopentanone, 2,5-bis-[2-ethylnaphtho[1,2-d]thiazol-2(1H)-ylidene)ethylidene]. Suitable hydrogen donors include: 2-mercaptobenzoxazole, 2-mercaptobenzothiazole, 4-methyl-4H-1,2,4,triazole-3-thiol, and the like. Other suitable hydrogen donors, which are preferred for compositions which contain N-vinyl-carbazole, are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

OTHER COMPONENTS

Other components conventionally added to photopolymerizable compositions can be present to modify the properties of the composition, provided they are compatible with the composition and do not adversely affect the properties of either the composition or the resulting hologram, such as optical clarity or adhesion to glass. Such components include: plasticizers, thermal stabilizers, optical brighteners, ultraviolet radiation absorbing material, adhesion modifiers, coating aids, pigments, dyes, and release agents.

COMPOSITION

The photopolymerizable compositions are dry films (i.e., dry to the touch). The binder is present in sufficient amount to form a film when the composition is coated. The photoinitiator system is present in sufficient amount to initiate polymerization of the monomer on exposure to actinic radiation. The monomer is present in sufficient amount to produce image differentiation on polymerization.

Proportions of ingredients in the photopolymerizable composition will generally be within the following percentage ranges, based on the total weight of the composition: binder 25 to 90%, preferably 45 to 75%; monomer(s), 5 to 60%, preferably, 15 to 50%; plasticizer, 0 to 25%, preferably, 0 to 15%; photoinitiator system, 0.1 to 10%, preferably 1 to 7%; and optional ingredients, 0 to 5%, typically 1 to 4%. If the amount of binder is below approximately 25%, or the amount of monomer exceeds approximately 60%, the composition has insufficient viscosity to form a solid film. At high levels of binder addition, exceeding approximately 90%, performance is unduly lost, and the resulting films have diminished values of refractive index modulation. Likewise, levels of monomer(s) used will be at least approximately 5% since lower quantities will not produce films having practical values of refractive index modulation.

MANUFACTURE

The photopolymerizable compositions are used as a layer applied to a dimensionally stable support. The composition may be directly coated onto the support by any conventional method, or may be cast as a film and laminated to the support by conventional methods. In either case the support generally provides only temporary dimensional stability for the photo-polymerizable composition prior to mounting on a substrate, and thus the support is releasable from the composition. If the composition is to be irradiated through the support, the support must be transparent to actinic radiation. For some applications, however, it may be desired to retain the support as a permanent overcoat or protective layer for the composition, in which case the support and the composition may be permanently bonded. A preferred support material is polyethylene terephthalate film.

Typically a temporary release film, e.g., polyethylene, polypropylene, polyethylene terephthalate, etc, is laminated to the other side of the photopolymerizable composition to protect it during shipment and storage. Conventional intermediate layers or coatings may be used to facilitate the adhesive and/or release characteristics of the support and/or the temporary release film.

HOLOGRAPHIC EXPOSURE

A coherent light sources (i.e., a laser) is used to holographically expose the photopolymerizable composition. Tunable lasers, which match the broad spectral sensitivity of these materials, may be used to advantage when the composition is sensitized across the visible spectrum.

Techniques for carrying out holographic exposures are well known to those skilled in the art. Early developments are described by E. N. Leith and J. Upatnieks, *Scientific American*, 212(6), 24–35 (June 1965). A useful discussion of holography is presented in "Holography" by C. C. Guest in *Encyclopedia of Physical Science and Technology*, Vol. 6, pp 507–519, R. A. Meyers, Ed., Academic Press, Orlando, Fla., 1987.

A diffraction grating can be characterized by its diffraction efficiency, that is the percent of incident radiation which is diffracted, and by its thickness. A holographic mirror can also be characterized by its diffraction (reflection) efficiency and by its thickness. A simple but useful theory for holographic gratings and mirrors, generally known as the "coupled wave theory", has been developed by H. Kogelnik, *Bell Syst. Tech, J.*, 48, 2909–2947, 1969. This theory treats the relationship between diffraction efficiency, hologram thickness, wavelength of incident radiation, and the angle of incident radiation. A useful discussion of this theory in regard to refractive index recording systems has been presented in Section II of W. J. Tomlinson and E. A. Chandross, Organic photochemical refractive-index image recording systems, *Adv. in Photochem.*, Vol. 12, J. N. Pitts, Jr., G. S. Hammond, and K. Gollnick, eds., Wiley-Interscience, N.Y., 1980, pp 201–281.

The coupled wave theory characterizes a hologram in terms of its refractive index modulation. This quantity is independent of hologram thickness and the wavelength and angle of incident radiation. Although the theory was developed for holographic gratings and mirrors, it can generally be used to describe the efficiency with which a hologram diffracts light.

Typically the temporary release film is removed, and the layer of photopolymerizable composition mounted on a substrate prior to exposure. The support may remain in place, acting as a coversheet, during exposure. The substrate must be transparent to actinic radiation. If the support remains in place during exposure, it must also be transparent to actinic radiation. Exemplary transparent substrates which may be selected to advantage include: glass, polyethylene terephthalate film, poly(methyl methacrylate), polycarbonate, and cellulose triacetate.

In the preparation of holograms from these photopolymerizable compositions, the hologram is fixed by a second, overall exposure to actinic radiation. The refractive index modulation of the hologram can be enhanced by heating to 100°-150° C. for about 0.5-2.0 hr following overall exposure, as described in Keys, U.S. Pat. No. 4,952,102.

Processes for altering the wavelength of response of holograms are described in Smothers, U.S. Pat. No. 4,959,283, and Gambogi, U.S. Pat. No. 5,182,180.

HEAD-UP DISPLAYS

A head-up display is an optical system that displays information on the windshield of a vehicle, such as the front windshield of an automobile or aircraft. The display simultaneously performs as an optical window (which transmits a nearly undistorted image) and as an analog of a conventional mirror or lens. Head up displays are described, for example, in Hartman, U.S. Pat. No. 4,613,200; Moss, U.S. Pat. No. 4,790,613; Wood, U.S. Pat. No. 4,842,389; Freeman, U.S. Pat. No. 4,998,784; and Keys, U.S. Pat. No. 4,950,567.

The optical combiner is a holographic mirror, or more complex holographic optics, constructed to efficiently reflect a selected, narrow bandwidth of light and transmit light of other wavelengths. The optical combiner is mounted in front of the operator, typically either in front of, on, or in the windshield. Using the selected wavelength, information is optically projected onto the combiner which reflects it into the operator's line of sight, superimposing the information on the operator's field of view. The operator can view the outside world through the combiner since the combiner reflects only a narrow band of radiation. Thus, the operator has immediate access to the information while continuing to view the path of the vehicle without the need to divert her or his attention to an instrument panel.

A head-up display typically has a light source, collimating optics, and an optical combiner. Referring to FIG. 1, windshield 40 has a first, inner glass ply 24, PVB layer 26, and second, outer glass ply 28. To form head-up display 38, optical combiner 10 is mounted in windshield 40 between inner ply 24 and PVB layer 26 in a position such that displayed information (i.e., vehicle speed, location gauge data, etc.) is readily available to viewer 42. The information to be displayed given on object 50 is projected from light source 44, which may be a cathode ray tube or a vacuum fluorescent display having a curved faceplate, etc., onto optical combiner 10. Optical combiner 10 reflects the information to viewer 42. Viewer 42 perceives the displayed information from object 50 as a virtual image 52, which appears to him or her as an image in front of the windshield. Other optical systems for projecting the information onto optical combiner 10 to produce head-up display 38 will be apparent to those skilled in the art. Likewise, details of other applications for combiner 10, such as mounting on a pivotal transparent screen or on the visor of a helmet, for aircraft applications, will be apparent to those skilled in the art.

To produce a head-up display a layer of the photopolymerizable composition is mounted on a transparent ply. In general, the layer will be mounted on the ply after it has been exposed and processed although, in some cases it may be desirable to coat or laminate the composition directly onto the ply and expose and process the composition on the ply. Alternatively, the composition may be exposed on the support, transferred to the ply, and processed. The exposed composition, processed or unprocessed, may be pressure laminated to the ply or may be attached with a transparent adhesive. If the unprocessed composition is laminated to the ply with heat, the lamination and thermal processing steps may be carried out at the same time.

After removal of the support, the hologram/ply assembly may be used as an optical combiner. For many applications, however, the assembly (after removal of the support) is then placed in a lamination press along with a second ply with a sheet of polyvinyl butyral (e.g, Butacite ® polyvinyl butyral resin sheeting) therebetween so that the hologram is in face to face contact with the polyvinyl butyral interleaf. Heat and pressure are applied (e.g., about 130° to 150° C.) whereby the reflection hologram is enhanced and fixed concurrently with forming a laminate consisting of first ply, hologram, polyvinyl butyral sheet, and second ply. A laminate is thereby formed that contains a holographic mirror substantially free of distortion. The laminate can be used as an optical combiner.

Alternatively, the second ply may be placed directly on the hologram so that a laminate is formed consisting of first ply, hologram, and second ply. Alternatively, instead of being laminated to the first ply, the hologram may be placed between sheets of polyvinyl butyral so a laminate is formed consisting of first ply, first polyvinyl butyral sheet, hologram, second polyvinyl butyral sheet, and second ply. Additional layers and coatings may added as desired.

Glass is typically used as the ply in such laminates, and is preferred. However, other transparent sheet materials, such as quartz, polymethyl methacrylate, polycarbonate, polystyrene, and the like, may also be used for other applications, provided that the thermal treatment conditions selected do not destroy the material.

Referring to FIG. 2, a preferred optical combiner comprises, in order: (A) a first adhesive layer 12; (B) a holographic recording composition 14 having a thickness of 5 to 20 microns; (C) a second adhesive layer 16; (D) a barrier layer 18 having a thickness of 2-10 microns; and (E) a third adhesive layer 20. The optical combiner has a thickness about 30 microns or less. The first, second, and third adhesive layers are independently selected from the group consisting of: (1) diisocyanates; (2) polyisocyanates; (3) blocked diisocyanates; (4) blocked polyisocyanates; (5) polyurethanes; (6) blocked isocyanate/polyurethane hybrids; (7) ultraviolet curable urethane acrylates; (8) blocked isocyanate/urethane acrylate hybrids; (9) blocked isocyanate/polyurethane/urethane acrylate hybrids; (10) epoxides; (11) blocked epoxides; (12) organosilanes; (13) acrylic, vinyl and nitrile elastomers; and (14) polyvinyl alcohol blends with an aqueous dispersion of said adhesive.

Glass is a preferred material for the inner and outer plies. Polyvinyl alcohol is a preferred barrier layer. Isocyanate-based adhesives, as described above, are useful and preferred for the first adhesive layer 12, the second adhesive layer 16, and the third adhesive layer 20. Aqueous dispersed polyurethane adhesives and ultraviolet curable urethane acrylate adhesives are preferred in particular. Blocked isocyanates are also especially preferred and may be used alone or in conjunction with other components such as preformed polyurethanes, urethane acrylates, etc.

The same adhesives that are useful and preferred in first adhesive layer 12 are also useful and preferred in second adhesive layer 16 and the third adhesive layer 20. In addition, polyvinyl alcohol blends containing many of these aqueous-based adhesives [blocked isocyanates such as Bayhydrol ® 116 (Miles Inc.), polyurethanes such as Witcobond® W-213 (Witco Corp.), water-stable organosilanes such as Chemlok® 610 (Lord; Erie, Pa.), etc.] are particularly preferred for the third adhesive layer.

In a preferred embodiment of optical combiner 10, the first and second adhesive layers are an isocyanate-based adhesive; the third adhesive layer is an isocyanate-based adhesive or a polyvinyl alcohol blend containing an aqueous-based adhesive; the barrier layer is polyvinyl alcohol, and the holographic layer is the photopolymerizable composition of this invention. In this preferred embodiment, the optical combiner 10 is mounted in windshield 40 between inner ply 24 and PVB layer 26 with the first adhesive layer in contact with the inner glass ply 24 and the third adhesive layer in contact with PVB layer 26 in a position such that displayed information is readily available to a viewer.

INDUSTRIAL APPLICABILITY

While the invention has been described in detail with respect to optical combiners, it will be appreciated that the film compositions described herein may be used for a variety of applications that employ reflection holograms, described below, as well as other applications that rely on differences of refractive index, such as optical waveguides and micro-lens arrays. Accordingly, as used herein, the term "refractive index imaging", or "refractive index images", as used herein encompasses all such applications in which the optical properties of the photopolymerizable film are selectively modified by a patterned exposure to actinic radiation.

Reflection holograms can be used as holographic optical elements, as in holographic notch filters, and in displays. A holographic notch filter rejects a selected narrow band of radiation and provides maximum transmission outside the selected band. Strong absorption of a narrow, selected portion of the spectrum allows protection from discrete laser lines yet allows for good visibility since the rest of the spectrum passes through the filter. Holographic notch filters provide protection against laser radiation for eyes and for sensors and other optical instruments in both military and non-military applications. Holographic notch filters are described, for example, in Keys, U.S. Pat. 4,965,152. Processes for altering the wavelength reflected by a reflection hologram are described in Smothers, U.S. Pat. No. 4,959,283.

Reflection holograms are suited for use in displays as, for example, in advertising or packaging; in security applications as, for example, on credit cards, bank notes, lottery tickets, and the like; and for information storage. Other specific uses for holograms prepared from the photosensitive elements of this invention will be evident to those skilled in the art.

The advantageous properties of this invention can be observed by reference to the following examples which illustrate, but do not limit, the invention.

EXAMPLES

| GLOSSARY | |
|---|---|
| AIBN | 2,2'-Azobisisobutyronitrile; CAS 78-67-1 |
| o-Cl-HABI | Biimidazole, 2,2'-bis[o-chlorophenyl]-4,4',5,5'-tetraphenyl-; CAS 1707-68-2 |
| HFP | Hexafluoropropylene |
| HMDS | Hexamethyldisilazane: CAS 999-97-3 |
| JAW | Cyclopentanone, 2,5-bis[(2,3,6,7-tetrahydro-1H,5H-benzo[i,j]quinolizin-9-yl)methylene]; CAS 125594-50-5. |
| MMT | 4-Methyl-4H-1,2,4-triazole-3-thiol; CAS 24854-43-1 |
| MVE | Methyl vinyl ether |
| NVC | N-Vinylcarbazole; 9-vinylcarbazole; CAS 1484-13-5 |
| Photomer® 4039 | Phenol ethoxylate monoacrylate; CAS 56641-05-5; Henkel Process Chemical Company, Ambler, PA |
| Sartomer® 349 | Ethoxylated bisphenol A diacrylate; CAS 24447-78-7; Sartomer Company, West Chester, PA |
| THF | Tetrahydrofuran |
| TFE | Tetrafluoroethylene |
| TMST | Trimethylsilyl triflate; CAS 27607-77-8 |
| Vinac® B-100 | Poly(vinyl acetate); M.W. 350,000; CAS 9003-20-7; Air Products, Allentown, PA |
| VAc | Vinyl acetate |
| VOS | Vinyl trimethylsilyl ether |
| VOH | Vinyl alcohol |

GENERAL PROCEDURES
POLYMER SYNTHESIS AND CHARACTERIZATION

Fluorinated polymers were prepared as described in examples infra. Inherent viscosities were measured on polymer solutions typically 0.20 wt % in THF at 30° C. (constant temperature bath) using a Cannon-Fenske viscometer. The VAc content was determined by quantitative hydrolysis of the acetate groups.

PHOTOSENSITIVE ELEMENT PREPARATION

Coating solutions were prepared in amber bottles under red light. All components were added to the solvents, then rolled until completely dissolved. The coating solutions had 14 or 15% total solids. It should be understood that "total solids" refers to the total amount of components which are not solvents, even though some of the components may be non-volatile liquids rather than solids at room temperature. All subsequent operations on coating solutions or resulting layers of photopolymerizable composition were performed under red lights.

A Talboys coater equipped with a 152.4 micron doctor knife, 3.7 m drier set at 50°–70° C., and a laminator station was used to coat the solutions onto a 50.8 micron thick support of clear polyethylene terephthalate. A coversheet of 23.4 micron thick polyethylene terephthalate was laminated to the coatings as they emerged from the drier. Photosensitive elements were stored in black polyethylene bags at room temperature.

SAMPLE EVALUATION

The coversheet was removed from a photosensitive element, and the element minus the coversheet, mounted by laminating the soft, tacky coating onto a clear 10×13 cm glass plate. The support was left in place during exposure and processing operations. The glass plate was coupled to a front surface mirror with a thin layer of xylene and mounted onto a computer-controlled, motorized stage. Holographic mirrors were recorded by exposing the photosensitive layer with a collimated 514 nm argon-ion laser oriented perpendicular to the surface of the photosensitive element so that the beam passed through the support, photosensitive layer, glass plate, xylene and then reflected back onto itself by the mirror surface. The laser beam diameter was about 2 cm and its intensity was about 10 mW/cm$^2$.

Sixteen mirrors were recorded in each photosensitive layer. Exposure times varied between 0.1 and 5 sec within each set of mirrors, corresponding to exposure energies of about 1 to 50 mW/cm$^2$.

The plates were exposed for 120 sec to ultraviolet and visible light from a Theimer-Strahler #5027 mercury-arc photopolymer lamp (Exposure Systems Corp., Bridgeport, Conn.) in a Douthitt DCOP-X exposure unit (Douthitt Corp., Detroit, Mich,). The intensity was about 3 mW/cm$^2$. The plates were heated at 120° C. for 2 hr in a forced-air convection oven.

The absorbance (optical density) spectrum of each holographic mirror were recorded using a spectro-photometer (Perkin Elmer model Lambda-9). Peak optical density (OD) and wavelength were measured. Maximum reflection efficiency ($R$max) was calculated from $R\text{max} = 1 - 10^{-OD}$. The bandwidth at 50% of peak reflection efficiency was measured. Plots of reflection efficiency versus exposure were constructed to determine photospeed, defined as the minimum exposure required to attain the maximum reflection efficiency observed in the photopolymerizable composition. In all cases the photospeed was less than 50 mJ/cm$^2$.

FILM THICKNESS AND HAZE MEASUREMENTS

Thickness was measured by laminating the film to glass followed by ultraviolet cure (120 sec) and bake (15 min at 100° C.). The support was removed. Coating thickness was measured with a Sloan-Dektac Model 3030 profilometer.

To measure haze, a set of three samples was laminated to microscope slides, exposed to ultraviolet light, and placed in an oven at 100° C. for 7 days. A Gardner haze meter was used to measure the % haze of each slide. The results were averaged and expressed as % per micron of coating thickness.

CALCULATION OF INDEX MODULATION

Refractive index modulation was calculated from hologram reflection efficiency, reflection wavelength, and full width at 90% maximum reflectance (bandwidth) using the well-known coupled wave theory (H. Kogelnik, *Bell Syst. Tech. J.*, 48, 2909–2947, 1969).

EXAMPLES

PREPARATION OF TFE/VAc/VOH/VOS POLYMERS

Examples 1–10 illustrate the preparation of copolymers. The copolymer components, expressed in weight percent, are summarized in Table 1.

EXAMPLE 1

This example illustrates preparation of a TFE/VAc copolymer. t-Butanol (12.0 Kg), 1.5 Kg methyl acetate, 8.0 Kg VAc and 1.80 Kg TFE was placed in a 38 liter stirred, water jacketed pressure reactor and equilibrated at 65° C. AIBN (140 mL of a 4.8% solution in methyl acetate) was injected into the vessel. The temperature was maintained at 65° C. by cooling the reactor jacket. After 1 hr, an additional 150 g of TFE was added over 30 min. Reaction was continued for an additional 50 min. The reactor contents were cooled to about 40° C., and an acetone solution of the methyl ether of hydroquinone was added. Unpolymerized TFE was vented off and the polymer solution discharged. Yield: 5450 g.

EXAMPLE 2

This example and the following three illustrate the preparation of TFE/VAc/VOH terpolymers with varying amounts of VOH. The TFE/VAc copolymer from Example 1 (50 g) was dissolved in 500 mL of acetone and 20 mL of methanol in a 1 L round bottom flask. Sodium methoxide (5.0 mL of a 2.00 wt % solution in methanol) was added. The solution was gently refluxed at 55.8° C. for 2 hr. Glacial acetic acid (4 g) was added. The polymer was precipitated into cold water, washed twice in distilled water, and dried to a constant weight under vacuum at around 100° C.

EXAMPLE 3

Procedure of Example 2 was followed except that 30 mL of methanol was used in the solvent mixture.

EXAMPLE 4

The TFE/VAc copolymer from Example 1 (150 g) was dissolved in 1500 mL of THF and 150 mL of methanol in a 3 L round bottom flask. When the polymer was completely dissolved, the solution was gently refluxed and 15.0 mL of methanolic 1.00% sodium methoxide quickly added. After 0.5 hr, glacial acetic acid (5 g) was added. The polymer was isolated and dried under vacuum around 130° C.

EXAMPLE 5

The procedure of Example 4 was repeated except that alcoholysis was carried out for 1.5 hr.

EXAMPLE 6

This example and the following four illustrate partial silylation of TFE/VAc/VOH terpolymers. The terpolymer from Example 2 (20 g) was dissolved in 300 mL of THF (dried over molecular sieves) in a 500 mL round bottom flask. The solution was heated at reflux, and 2.0 g of HMDS added along with 10 drops, (about 0.12 g) of TMST. The solution was heated at reflux under a slow nitrogen purge for 1 hr. The polymer was precipitated in cold tap water, washed twice in distilled water, and dried to constant weight under vacuum around 100° C.

The composition of the tetrapolymer was calculated from the intensity of the OH band obtained from an infrared scan taken on a thin polymer film. The mol % of nonetherified vinyl alcohol groups was determined from a calibration curve. The mol % of trimethyl silyl ether was determined from the difference in OH concentration between the starting polymer and the silylated polymer.

EXAMPLE 7

The procedure of Example 6 was repeated with 20 g of polymer made in Example 4, 4.0 g of HMDS and 0.15 mL of trimethylsilyl triflate.

EXAMPLE 8

The terpolymer prepared in Example 4 (20 g) was dissolved in 300 mL of dry THF in a 1 L round bottom flask and the solution heated at reflux. HMDS (8 g) and 0.15 mL of trimethylsilyl triflate were added. The solution was heated at reflux under a slight nitrogen purge for 1 hr. The polymer was isolated as in Example 6. Yield: 22.9 g. From the weight gain it was calculated that 83% of the hydroxyl groups were silylated. By infrared analysis (Example 6) a value of 86% was determined.

EXAMPLE 9

The procedure of Example 6 was repeated, except that 20 g of the terpolymer from Example 5 was used with 5.2 g of HMDS and 0.15 mL of TMST. Quantitative recovery of the silylated polymer indicated a 3.18 g weight gain. From this weight gain, a 69% conversion of hydroxyls to trimethylsilyl ether groups was calculated. By infrared analysis (Example 6) a value of 70% was calculated.

EXAMPLE 10

Fifteen grams of a TFE/VAc/VOH terpolymer, prepared essentially as described in Example 5, was dissolved in 250 mL of dry THF. HMDS (6.2 g) and 0.15 mL of TMST were added to the refluxing solution. Reaction continued under nitrogen for 72 min. The polymer was precipitated into cold tap water, washed twice in distilled water, and dried under vacuum to a constant weight at about 100° C. Silylation: about 86% (infrared).

TABLE 1

| Example | TFE | VAc | VOH | VOS |
|---|---|---|---|---|
| 1[a] | 22.3 | 77.7 | 0 | 0 |
| 2 | 23.3 | 71.7 | 5.0 | 0 |
| 3 | 23.6 | 70.2 | 6.2 | 0 |
| 4 | 24.5 | 64.9 | 10.6 | 0 |
| 5 | 25.3 | 60.7 | 14.0 | 0 |
| 6 | 22.3 | 68.7 | 2.1 | 6.9 |
| 7 | 21.8 | 57.7 | 2.7 | 17.8 |
| 8 | 21.3 | 56.4 | 1.3 | 21.0 |
| 9 | 21.7 | 52.3 | 3.7 | 22.3 |
| 10 | 19.9 | 51.9 | 1.7 | 26.5 |

[a]Inherent Viscosity: 1.60 dL/g.

EXAMPLE 11

This example and the following three illustrate the preparation of copolymers comprising HFP. The copolymer components, expressed in weight percent, are summarized in Table 2.

Example 11 illustrates the preparation of a HFP/VAc copolymer. HFP (1100 g) was added to 700 g of t-butyl alcohol and 850 g of vinyl acetate in a chilled and evacuated 3.8 liter stirred pressure reactor. The reactor was equilibrated at 60° C. and 3.0 g of AIBN, dissolved in 60 mL of methyl acetate, added over a period of 6 min. As soon as polymerization started, evidenced by a slight exotherm, 450 g of VAc was added over 4 hr at a rate of 2.0 mL/min. Reaction was continued for an additional 98 min. The reactor was cooled to about 40° C. and its contents discharged. Yield: 878 g.

EXAMPLE 12

This example illustrates preparation of HFP/VAc/VOH terpolymer. A blend of several HFP/VAc copolymers, all prepared by the procedure of Example 11, was used. The calculated inherent viscosity of this blend was 1.31 dL/g and the copolymer had, on the average, 78.7 wt % VAc. Alcoholysis was carried out in a 22 L round bottom flask, equipped with a heating mantle, thermocouple, reflux condenser and a stirrer.

HFP/VAc copolymer (1500 g) was dissolved in 13,320 g of THF and 1,190 g of methanol. The solution was heated at reflux and 300 mL of a 1.00% methanolic solution of sodium methoxide added. Heating at reflux was continued for 1 hr. Glacial acetic acid (40 mL) was added. The polymer solution was exposed for a brief time to superheated steam at about 120° C. to remove the solvent. The polymer was collected in a water reservoir, filtered, and dried in a circulating air oven at 60° C.

EXAMPLES 13 AND 14

These examples illustrate partial silylation of HFP/VAc/VOH terpolymer. The procedures of Examples 6 and 7 were repeated with the polymer produced in Example 12 to obtain the polymers of Examples 13 and 14.

TABLE 2

| Example | HFP | VAc | VOH | VOS |
|---|---|---|---|---|
| 11[a] | 21.6 | 78.4 | 0 | 0 |
| 12 | 23.5 | 65.3 | 11.2 | 0 |
| 13 | 22.6 | 62.7 | 8.4 | 6.3 |
| 14 | 21.5 | 59.6 | 4.2 | 14.6 |

[a]Inherent Viscosity: 1.30 dL/g.

Examples 15–17 illustrate the preparation of copolymers comprising TFE and MVE. The compositions of these polymers, expressed in weight percent, are summarized in Table 3.

EXAMPLE 15

This example illustrates preparation of a TFE/VAc/MVE terpolymer. A stirred, water jacketed 3.8 liter pressure reactor was purged with nitrogen and subsequently charged with 1000 g of t-butyl alcohol, 800 g of vinyl acetate, 100 g of MVE, 210 g of TFE, and 1.0 g of sodium carbonate. The reaction mixture was heated to 65° C., and AIBN (0.7 g) in 35 mL of methyl acetate was added. The reaction was maintained at 65° C. for 135 min. The reactor contents were cooled to about 40° C., residual pressure was vented, and the viscous polymer solution was discharged. Yield: 506 g. VAc content: 68.3 wt % (quantitative hydrolysis). The other two comonomers were calculated from % carbon and hydrogen. % C: found 48.7%, 48.53%. % H: found 5.53, 5.57. This corresponds to: 23.84 wt % TFE, 68.33 wt % VAc and 7.83 wt % MVE. Inherent viscosity: 1.72 dL/g, indicating a high molecular weight.

EXAMPLE 16

This example illustrates preparation of a TFE/VAc/MVE/VOH terpolymer. Partial alcoholysis of the TFE/VAc/MVE polymer from Example 15 was carried out as described in Example 2.

EXAMPLE 17

This example illustrates partial silylation of a TFE/VAc/MVE/VOH polymer. Silylation of the TFE/VAc/MVE/VOH polymer from Example 16 was carried out by essentially as described in Example 7.

TABLE 3

| Example | TFE | VAc | MVE | VOH | VOS |
|---|---|---|---|---|---|
| 15[a] | 23.9 | 68.3 | 7.8 | 0 | 0 |
| 16 | 25.6 | 58.0 | 7.9 | 8.5 | 0 |
| 17 | 23.5 | 53.1 | 7.7 | 2.0 | 13.7 |

[a]Inherent Viscosity: 1.72 dL/g

CONTROL EXAMPLES A–E AND EXAMPLES 18–22

These examples illustrate the preparation of holograms from photosensitive elements comprising hydrolyzed and silylated TFE/VAC polymers.

Coating solutions containing 14 wt % solids in 85:15 dichloromethane:methanol were made up. These solutions contained: 63.7 wt % binder, as indicated in Table 1; 22.0% Photomer® 4039; 8.0% NVC; 3.0% Sartomer 349; 2.0% o-Cl HABI; 1.0% MMT; 0.2% FC-430; and 0.1% JAW. The solutions were coated, exposed, and evaluated as described in the General Procedures. Results are given in Table 4.

TABLE 4

| Ex. | Binder | Thickness (μm) | λmax (nm) | OD$^a$ (max) | FWHM$^b$ | BW90$^c$ | RIM$^d$ | Haze (%/μm) |
|---|---|---|---|---|---|---|---|---|
| A | 1 | 10.4 | 505 | 2.24 | 24.0 | 21.0 | 0.062 | 0.075 |
| B | 2 | 11.1 | 503 | 2.71 | 22.8 | 18.7 | 0.054 | 0.065 |
| C | 3 | 9.7 | 502 | 2.36 | 22.8 | 18.0 | 0.052 | 0.088 |
| D | 4 | 10.2 | 505 | 2.06 | 21.3 | 16.7 | 0.050 | 0.070 |
| E | 5 | 12.6 | 505 | 1.44 | 17.4 | 10.3 | 0.036 | 0.079 |
| 18 | 6 | 9.8 | 504 | 2.65 | 24.4 | 21.0 | 0.060 | 0.088 |
| 19 | 7 | 8.6 | 504 | 2.52 | 25.7 | 21.9 | 0.063 | 0.064 |
| 20 | 8 | 10.4 | 504 | 2.93 | 27.6 | 23.6 | 0.068 | 0.131 |
| 21 | 9 | 13.3 | 507 | 3.66 | 28.8 | 22.6 | 0.064 | 0.096 |
| 22 | 10 | 10.7 | 505 | 2.48 | 27.4 | 21.7 | 0.062 | 0.187 |

$^a$Optical density at λmax.
$^b$Full width at half maximum reflectance (bandwidth).
$^c$Full width at 90% maximum reflectance (bandwidth).
$^d$Refractive index modulation.

From the data obtained from Control Examples A–E, evaluation of the holographic properties of partially alcoholized TFE/VAc copolymers indicates a decline of the refractive index modulation with increasing amounts of VOH.

The data obtained from Examples 18–22 indicate that, on partial silylation, the refractive index modulation is restored.

CONTROL EXAMPLES F–G AND EXAMPLES 23–24

These examples demonstrate the effect of hydrolysis and silylation of HFP/VAc binders on the performance of holographic compositions.

Coating solution for Example F contained: 65.1 wt % binder, as indicated in Table 2; 17.5% Photomer® 4039; 8.3% NVC; 3.1% Sartomer 349; 3.1% o-Cl HABI; 2.6% MMT; 0.21% FC-430; and 0.12% JAW in a 15 wt % solution in 7520:5 dichloromethane:2-butanone:methanol.

Coating solution for Examples G, 23 and 24 contained: 66.2 wt % binder, as indicated in Table 2; 17.0% Photomer® 4039; 8.0% NVC; 3.0% Sartomer 349; 3.0% o-Cl HABI; 2.5% MMT; 0.20% FC-430; and 0.12% JAW in a 15 wt % solution in 50:25:25 dichloromethane:2-butanone:methanol.

TABLE 5

| x. | Binder | Thickness (μm) | λmax (nm) | OD$^a$ (max) | FWHM$^b$ | BW90$^c$ | RIM$^d$ | Haze (%/μm) |
|---|---|---|---|---|---|---|---|---|
| F | 11 | 9.2 | 500 | 3.28 | 27 | 22 | 0.063 | 0.16 |
| G | 12 | 10.1 | 502 | 2.50 | 23 | 19 | 0.055 | 0.10 |
| 23 | 13 | 9.2 | 503 | 2.44 | 27 | 22 | 0.064 | 0.27 |
| 24 | 14 | 9.6 | 502 | 2.45 | 26 | 21 | 0.061 | 0.44 |

$^a$Optical density at λmax
$^b$Full width at half maximum reflectance (bandwidth).
$^c$Full width at 90% maximum reflectance (bandwidth).
$^d$Refractive index modulation.

The data from Control Examples F–G and Examples 23–24 indicate a similar behavior for the HFP/VAc copolymers as observed for the TFE/VAc copolymers, which is a decline of the refractive index modulation with increasing amounts of VOH and subsequent restoration of the refractive index modulation upon partial silylation.

CONTROL EXAMPLES H–I AND EXAMPLE 25

These examples demonstrate the effect of hydrolysis and silylation of TFE/VAc/MVE binders on the performance of holographic compositions.

Coating solution for Control Examples H–I contained: 64.7 wt % binder (as indicated in Table 3), 17.6% Photomer@ 4039, 8.7% NVC, 3.1% Sartomer 349, 3.1% o-Cl HABI, 2.6% MMT, 0.21% FC-430, and 0.12% JAW in a 15 wt % solution in 75:20:5 dichloromethane:2-butanone:methanol.

Coating solution for Example 25 contained: 66.1 wt % binder (as indicated in Table 3), 17.1% Photomer@4039, 8.0% NVC, 3.0% Sartomer 349, 3.0% o-Cl HABI, 2.5% MMT, 0.20% FC-430 and 0.12% JAW. Components were coated from a 15 wt % solution in 50:25:25 dichloro-methane:2-butanone:methanol. Results are given in Table 6.

TABLE 6

| Ex. | Binder | Thickness (μm) | λmax (nm) | OD$^a$ (max) | FWHM$^b$ | BW90$^c$ | RIM$^d$ | Haze (%/μm) |
|---|---|---|---|---|---|---|---|---|
| H | 15 | 13.6 | 505 | 3.32 | 24 | 18 | 0.053 | 0.08 |
| I | 16 | 9.1 | 500 | 1.96 | 20 | 15 | 0.052 | 0.08 |
| 25 | 17 | 7.5 | 499 | 2.16 | 26 | 22 | 0.067 | 0.22 |

$^a$Optical density at λmax.
$^b$Full width at half maximum reflectance (bandwidth).
$^c$Full width at 90% maximum reflectance (bandwidth).
$^d$Refractive index modulation.

The data from Control Examples H–I and Example 25 indicate a similar behavior for the TFE/VAc/MVE copolymers as observed for the TFE/VAc copolymers, which is a decline of the refractive index modulation with increasing amounts of VOH and subsequent restoration of the refractive index modulation upon partial silylation.

CONTROL EXAMPLES J–M AND EXAMPLES 26–29

These examples demonstrate the effect of hydrolysis and silylation of TFE/VAc binders on both adhesion to glass and refractive index modulation of holographic compositions.

Sheet glass about 3 mm thick was cut into pieces about 2.5 cm by 7.5 cm. One side of each piece of glass was sprayed with a 1.5% solution of polyisocyanate primer (Solithane ® S-113; Morton International, Chicago, Ill.) in methyl isobutyl ketone. The solvent was driven off by heating for 10 min at 120° C.

Photosensitive elements were prepared as described in Examples 18–22. The binders used are given in Table 7. The coversheet was removed and the thus exposed surface of the composition laminated to the primed side of a piece of glass. The support was removed and the primed side of a second piece of glass placed on the thus exposed surface of the photosensitive layer to form an element consisting of: glass, primer, photosensitive layer, primer, and glass. These elements were autoclaved at about 1200 kPa (about 175 psi) and 145° C. The time above 145° C. was 0.51–1.0hr. The time above 80° C. was usually 2–3 hr.

Lap shear strength was measured by a Model 1122 Instron tester, using a 454.5 Kg load cell. The crosshead speed was 5 cm/min. Lap shear strength is given in Table 7.

TABLE 7

| Example | Binder | RIM$^a$ | Lap Shear Stress$^b$ |
|---------|--------|---------|----------------------|
| J       | 1      | 0.062   | 889                  |
| K       | 2      | 0.054   | 2827                 |
| 26      | 6      | 0.060   | 2103                 |
| L       | 4      | 0.050   | 2020                 |
| 27      | 7      | 0.063   | 1227                 |
| 28      | 8      | 0.068   | 1958                 |
| M       | 5      | 0.036   | 448                  |
| 29      | 9      | 0.064   | 3620                 |

$^a$Refractive index modulation (from earlier examples).
$^b$in kPa (1 kPa = 6.895 psi)

The data from Control Examples J–M indicate that adhesion to primed glass is poor when the hologram binder is a TFE/VAc copolymer (Ex. J) or when the TFE/VAc/VOH terpolymer has a relatively high amount of VOH (Ex. M). Intermediate levels of VOH (Ex. K and L) give good adhesion to glass but poor refractive index modulation. The data from Examples 26–29 show that, on partial silylation, excellent adhesion to glass and high values of refractive index modulation are obtained.

Having described the invention, we now claim the following and their equivalents.

1. In a photopolymerizable film composition containing a binder, an addition polymerizable ethylenically unsaturated monomer, and a photoinitiator adapted for the preparation of refractive index images, the improvement wherein said binder is a copolymer comprising the formula:

$$(M)_w(VAc)_x(VOH)_y(VOS)_z$$

wherein M is a fluoromonomer, VAc is vinyl acetate, VOH is vinyl alcohol, and VOS is vinyl trimethylsilyl ether; w, x, y, and z are weight percents and w is approximately 5 to 30, x is approximately 40 to 80, y is approximately 0 to 20, and z is approximately 2 to 30; with the proviso that said polymer contains about 3 to 23% fluorine by weight.

2. The composition of claim 1 wherein said fluoromonomer is selected from the group consisting of tetrafluoroethylene, hexafluoropropylene, and mixtures thereof.

3. The composition of claim 1 wherein w is 20 to 27, x is 50 to 75, y is 2 to 10, and z is 5 to 25.

4. The composition of claim 3 wherein said fluoromonomer M is selected from the group consisting of tetrafluoroethylene, hexafluoropropylene, and mixtures thereof.

5. The composition of claim 1 or 4 wherein said composition comprises, by weight, approximately 25 to 90% of said binder, 5 to 60% of said monomer, and 0.1 to 10% of said photoinitiator.

6. The composition of claim 1 or 4 imaged to contain a refractive index image.

7. The composition of claim 1 or 4 imaged to contain a reflection hologram.

8. The composition of claim 7 laminated to a glass substrate.

9. A laminated structure comprising, in order,
(a) a first ply;
(b) a photopolymerizable film imaged to contain a refractive index image, said film comprising, by weight, approximately 25 to 90% binder, 5 to 60% addition polymerizable ethyhenically unsaturated monomer, and 0.1 to 10% photoinitiator, said binder comprising a copolymer having the formula:

$$(M)_w(VAc)_x(VOH)_y(VOS)_z$$

wherein M is a fluoromonomer, VAc is vinyl acetate, VOH is vinyl alcohol, and VOS is vinyl trimethylsilyl ether; w, x, y and z are weight percents and w is approximately 5 to 30, x is approximately 40 to 80, y is approximately 0 to 20, and z is approximately 2 to 30; with the proviso that said copolymer contains approximately 3 to 23% fluorine by weight; and
(c) a second ply.

10. The laminate of claim 9 wherein said first and second plies are glass.

11. The laminate of claim 9 or 10 wherein a polyvinyl butyral sheet is between said imaged photopolymerizable film and said second ply.

12. The laminate of claim 9 wherein said fluoromonomer M is selected from the group consisting of tetrafluoroethylene, hexafluoropropylene, and mixtures thereof.

13. The laminate of claim 12 wherein said first and second plies are glass and wherein a polyvinyl butyral sheet is between said imaged photopolymerizable film and said second ply.

14. The laminate of claim 13 wherein a barrier layer is between said imaged photopolymerizable sheet and said polyvinyl butyral sheet.

15. The laminate of claim 14 wherein said barrier layer is a polyvinyl alcohol film.

16. The laminate of claim 9 wherein the refractive index image is a reflection hologram.

* * * * *